United States Patent [19]

Lubrano et al.

[11] Patent Number: 4,984,355

[45] Date of Patent: Jan. 15, 1991

[54] TOOL FOR INSERTING/EXTRACTING PACKAGE FROM SOCKET ON PC BOARD

[75] Inventors: Rocco V. Lubrano, Norristown; Ladislaw D. Cubranich, Lansdale, both of Pa.

[73] Assignee: Unisys Corporation, Detroit, Mich.

[21] Appl. No.: 319,500

[22] Filed: Mar. 6, 1989

[51] Int. Cl.⁵ ............................................. H05K 13/04
[52] U.S. Cl. .............................................. 29/741; 29/764
[58] Field of Search .......................... 29/764, 741, 758

[56] References Cited

U.S. PATENT DOCUMENTS

| | | | |
|---|---|---|---|
| 4,392,301 | 7/1983 | Hannes et al. | 29/741 |
| 4,583,287 | 4/1986 | McDevitt et al. | 29/741 |
| 4,597,174 | 7/1986 | Sevigny | 29/764 X |
| 4,615,110 | 10/1986 | Crone | 29/764 X |

Primary Examiner—Carl E. Hall
Attorney, Agent, or Firm—John J. McCormack; Nathan Cass; Mark T. Starr

[57] ABSTRACT

A dual purpose tool for inserting and extracting a PGA multi-in package into associated socket on a PC board.

18 Claims, 6 Drawing Sheets

TOOL FOR INSERTING/EXTRACTING PACKAGE FROM SOCKET ON PC BOARD

This Disclosure relates to a tool for inserting and extracting packages from a socket on a PC board.

BACKGROUND, FEATURES

Workers in the art of manufacturing and using printed circuit (PC) boards are aware of difficulties associated with inserting and removing packages, e.g., a multi-pin-grid array (PGA) package from a socket thereon. It is, of course, desirable to minimize the number of tools required at the manufacturing or repair) site for this; thus, it would be desirable to, if possible, have a single tool for both insertion and extraction operations. The art presently does not provide such—this is one object of this invention.

A related object is to provide such a tool for more reliably inserting and extracting such packages. A more particular object is to do so using a tool presenting a pair of gripper arms and associated lead (jack-) screw thrusting against these to grip such packages more positively. Another object is to provide such a tool wherein the travel of the package into the socket may be automatically limited to prevent "bottoming" and associated damage to the package.

Thus, it is an object to address at least some of these concerns and teach ways of ameliorating them, to provide at least some of the described features and advantages.

BRIEF DESCRIPTION OF THE DRAWINGS

These and other features and advantages of the present invention will be appreciated by workers as they become better understood by reference to the following detailed description of the present preferred embodiments which should be considered in conjunction with the accompanying drawings.

The invention will be better appreciated by workers upon consideration of the following detailed description of some preferred embodiments.

DESCRIPTION OF PREFERRED EMBODIMENTS

General description, background

Figure 1:
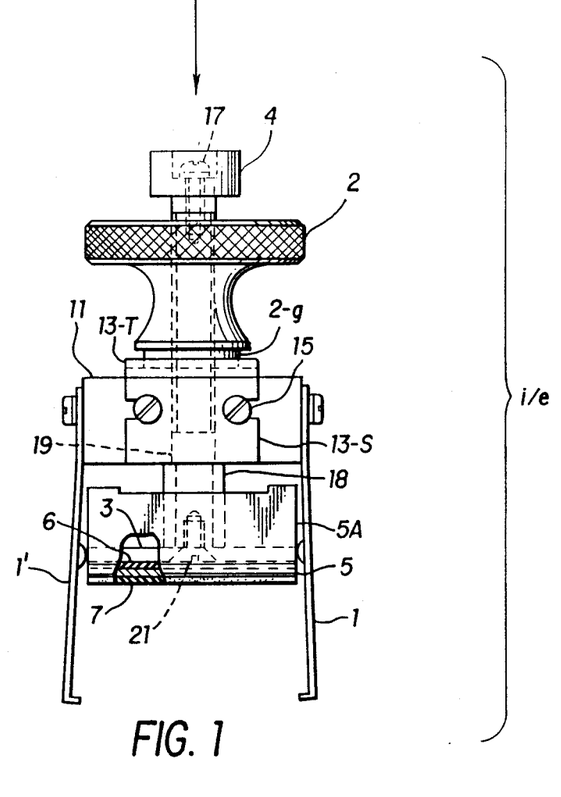
FIG. 1 is a schematic side view, in partial section, of one tool embodiment in its "insertion-mode", with the "work" exploded-away; and shown in FIG. 1A.
Figure 2:
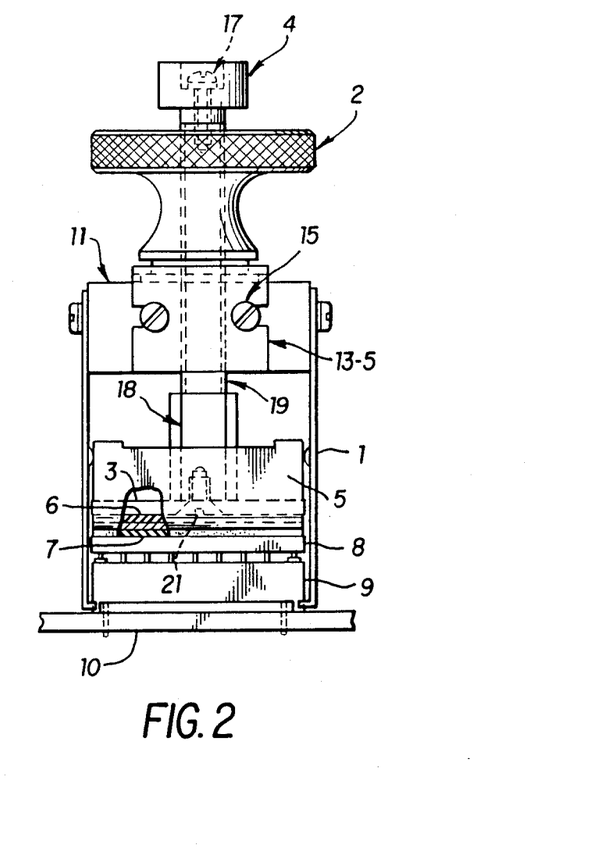
FIG. 2 is the same, with the work (PGA) incipiently engaged by the tool and about to be depressed into a PCB socket.
Figure 3A:
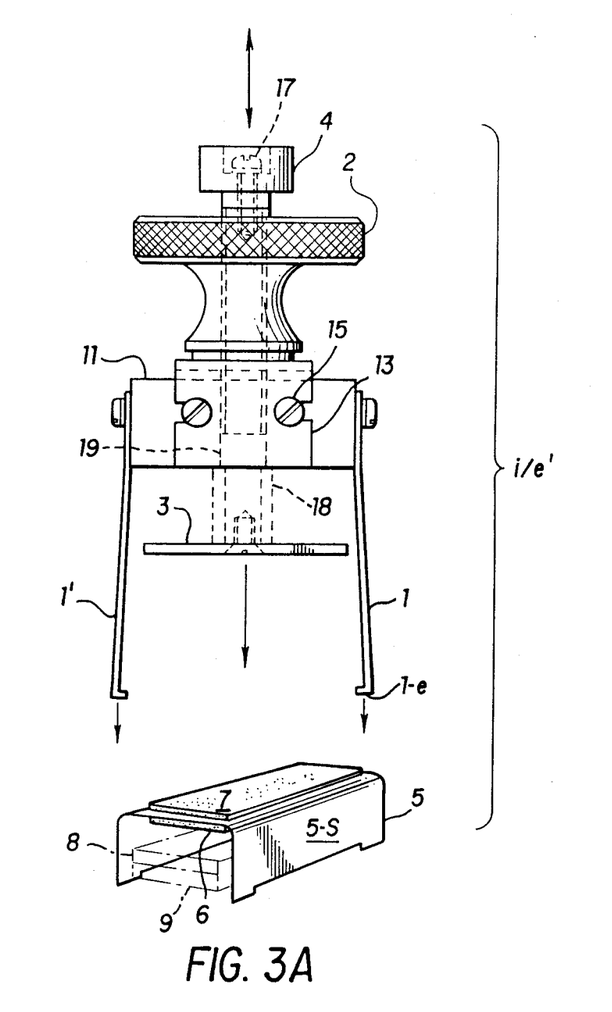
FIGS. 3A, 3B show the same tool in "extraction mode", about to extract a fully-inserted PGA.
Figure 3B:
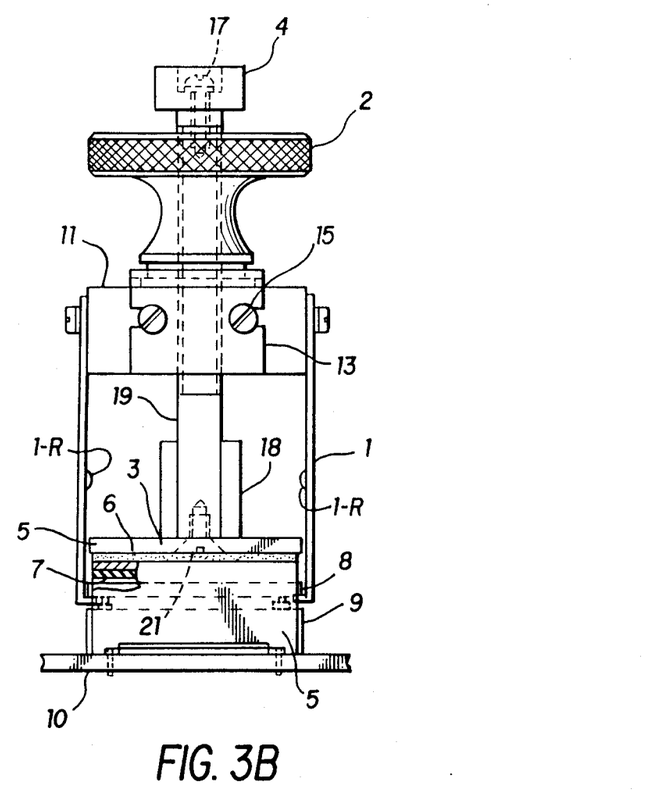
Figure 4:
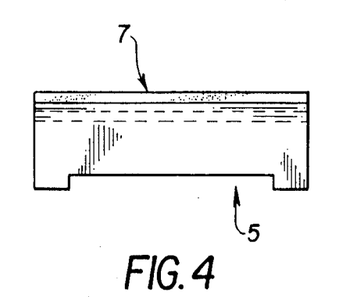
FIG. 4 is an enlarged side view of an adapter part 5 of this tool, with FIG. 5 a sectional showing thereof.
Figure 5:
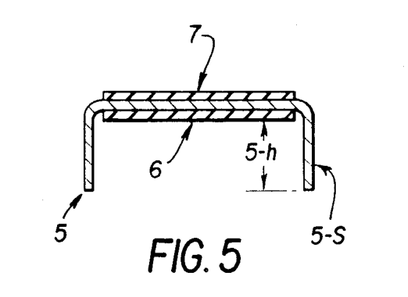
Figure 6:
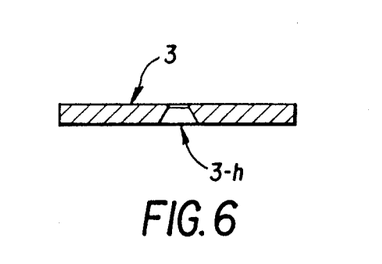
FIG. 6 is a side view of a pressure plate 3 of this tool.
Figure 7:
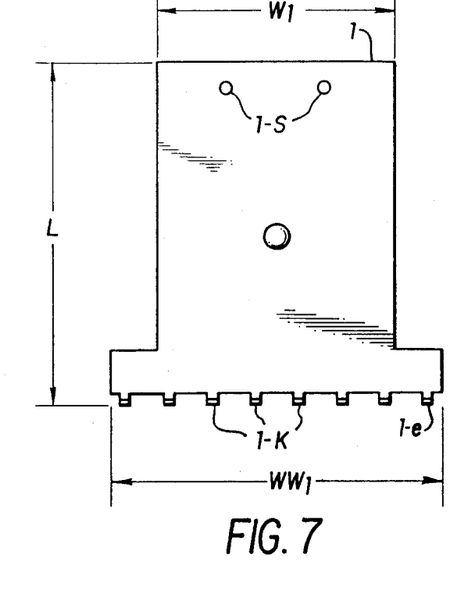
FIG. 7, 7A are a side and FIG 7A, an end view of a gripper arm 1 of this tool.
Figure 7A:
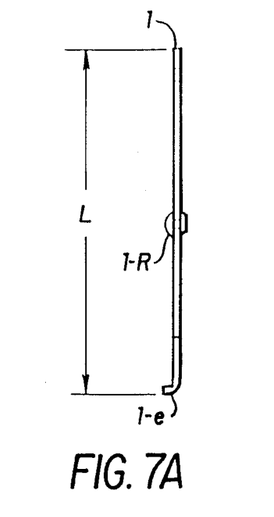
Figure 8:
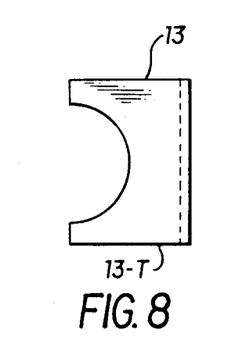
FIG. 8, 8A are a top and FIG. 8A, a front view of a knob-engaging bracket 13 part of this tool.
Figure 8A:
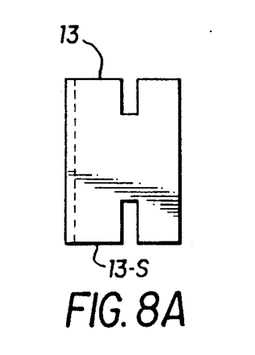

FIGS. 1-3 illustrate an insertion/extraction tool embodiment engaged with an exemplary work piece.

This, and other means discussed herein, will generally be understood as selected, designed, made and operating as presently known in the art, except where otherwise specified. And, except as otherwise specified, all materials, methods, and devices and apparatus herein will be understood as implemented by known expedients according to present good practice.

PREFERRED INSERTION EMBODIMENT; FIGS. 1, 2, 4–8

FIGS. 1, 2 show a preferred embodiment of a combination insertion/extraction tool i/e in "insertion mode", i.e., adapted to insert a (PGA) package from a PC board socket, with FIGS. 4–8 showing parts thereof. In particular, FIG. 1 shows tool i/e exploded-away from its subject work, namely PGA package 8 which is to be inserted into PGA socket 9 mounted on PC board 10 (workers in the art will recognize such work). PC board 10 may, for instance, typically contain a number of PGA sockets which accept pin grid arrays [PGA; here assume 17 sockets accepting 17 #224 type pin grid arrays]. Workers will assume that the PCB is "unfixed", i.e., is not rigidly anchored to a fixed base—thus, a package 8 must be inserted/extracted from its PCB socket while the PCB is outside of its "card-cage", and thus accessible (as workers realize).

In FIGS. 1, 2, the principal object is to enable the insertion of PGA 8 into such a socket reliably and safely (and, later, to remove it without requiring an unsoldering procedure, etc.—FIGS. 3). Unless a PGA is properly inserted into, or removed from, its socket, damage can result (to the PGA and/or to the socket) as workers well realize. It is conventional to have 2 different tools for such. The PGA must be properly oriented in the socket, and any tool used to insert the PGA should, desirably, apply pressure somewhat evenly distributed across the PGA. And, insertion pressure should end at a prescribed "insertion depth" within the socket. As workers know, a "skewed" orientation of the PGA, or "off-center" thrusting thereof or thrusting too far into the socket (so as to "bottom", etc.) can damage the PGA and/or the socket.

Insertion/extraction tool i/e will be recognized as adapted to accomplish these objects and functions in the subject embodiment. Tool i/e provides a pair of gripper arms 1 normally (FIG. 2) spaced-apart sufficient to span a given socket length (Ls, FIG. 1A), each arm 1,1' having a distal end 1-e curled, or turned under, sufficient to grip the "base" edge of the socket 9. (See FIG. 7 also). Arms 1,1' are "spreadable" as indicated in FIG. 1, to allow objects therebetween. Arms 1 are mounted from a common mounting block 1.1 (e.g., attached by screws as indicated).

Block 11 journals a "jack screw" 19 thrust therethrough centrally, and adapted to thrust a pressure plate 3 toward, and away from the upper exposed surface of a PGA package 8, as indicated, for instance, in FIG. 2. Jack screw 19 is threadably engaged to be rotated manually by a knurled internally-threaded thumb-wheel or knob 2 attached on block 11. Thus, rotation of knob 2 will thrust screw 19 and plate 3 up and down along the vertical axis of the tool (see arrow, FIG. 1). A stop 4 is preferably provided at the opposite (top, proximal) end of jack screw 19, being attached thereto by a screw 17 or like means.

A pair of knob-retaining brackets 13 are provided on block 11; each fastened (screw 15) to a side of block 11 and inserted into a respective side of a groove 2-g cut into knob 2, thus retaining knob 2 on block 11. Brackets 13 (FIG. 8) retain knob 2 so that jack-screw 19 is able to be mounted threadably in knob 2 which is to rotate screw 19, driving it up and down relative to block 11 and knob 2. A stop 4 on the upper end of screw 19 limits its downward travel (away from block 11) while another stop 18 at the opposite (lower) end of screw 19 limits its upward travel (back to block 11). Brackets 13 may comprise a suitable rigid material, e.g., steel. Block 11 may be any rigid material such as aluminum alloy. Jack screw 19 may comprise any conventional rigid screw stock such as a 0.375" brass rod (here, assume left-hand thread along the upper half, for purposes of discussion).

Jack screw 19 is shown "fully-up" in FIG. 1 with stop 18 seated against the underside of block 11 and gripper arms 1,1' cammed-out (see below; position, height of stop 18, length of screw 19 determines this); screw 19 may be assumed as "fully-down" when stop 4 is seated against knob 2, and arms 1,1' lie relatively "straight" (length of screw 19, position of stop 4 determine this position—see below also).

At the distal (lower) end of screw 19, and adjacent stop 18, pressure plate 3 is secured (e.g., by screw 21 into 19, as shown in phantom).

A second, separable part of this tool i/e is a U-shaped adapter 5 (see FIGS. 3A, 4, 5), adapted, principally, to facilitate extraction (discussed below) and arranged to be "stored" conveniently on plate 3 at other times (e.g., during "insertion"). Adapter 5 has a median section flanked by a pair of orthogonal legs 5-S. A resilient magnetic pad 6 is secured on one side of this median section; and a resilient elastomeric cushion 7 secured on the other side (see FIG. 3A).

Adaptor 5 may comprise any rigid material (e.g., 5 mil steel); cushion 7 may comprise a rubber strip bonded on 5 for resilient engagement with a PGA (e.g., 60 mil rubber pad 7 with double-sided adhesive, as known in the art). Magnetic resilient pad 6 is adapted to magnetically couple adapter 5 (removably) to plate 3; pad 6 may comprise, on the opposite side thereof, a 60 mil thick magnetic rubber pad 6 with adhesive backing as known in the art.

During "insertion mode" (FIG. 1, FIG. 2) adapter 5 is conveniently "stored" on the tool i/e by simply pressing magnetic pad 6 against plate 3. In this condition (FIG. 1, FIG. 2) pad 7 will be understood as provided to be thrust by plate 3 (screw 19) against PGA package 8 so as to avert damage to 8 and to distribute pressure relatively evenly. Magnetic rubber pad 6 thus serves to removably (magnetically) couple adapter 5 to pressure plate 3. The two upturned legs 5-S of adapter 5 (FIGS. 4, 5, 3A) serve to provide a solid base for plate 3 on socket 9 during extraction, while arms 1,1' grip and pull PGA 8 (see FIG. 3A, 3B). Thus, legs 5-S will be high enough to allow full extraction of PGA 8 (see below).

Pressure plate 3 (see also FIG. 6) is fastened at the distal end of jack screw 19 (e.g., by screw 21 through hole 3-h, countersunk to insert the screw head). Pressure plate 3 will comprise a somewhat magnetic material (e.g., steel of appropriate size).

Figure 1A:
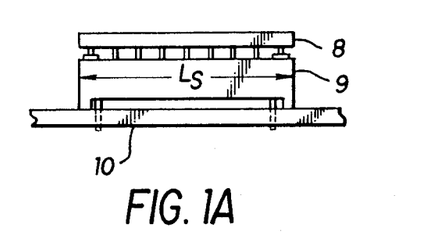

Gripper arms 1,1'(of width $w_1$) will be understood as made of any suitable rigid material (such as 22 mil STN steel), being attached to block 11 (e.g., via screws through holes 1-S) and suspended therefrom a sufficient length L to engage prescribed packages (e.g., 8, 9, FIG. 1A). Arms 1,1' will be observed as provided with an enlarged distal end (width WW1, FIG. 7), the edges of which (1-e) are turned up, as mentioned, to grip the underside of a prescribed PGA 8 and/or socket 9. This turned-edge 1-e is also preferably cut out (serrated to clear PGA package or socket pins as workers will appreciate) to present an array of teeth 1-K extending about 80 mils beyond the plane of the arm, (beyond $w_1$, sufficient to engage prescribed package). Teeth 1-K may be about 40 mils wide or any uniform suitable width, with intermediate slots for clearing pins etc. Arms 1,1' may be fastened with screws or the like to the mounting block 11 (see screw holes 1-S) and are also preferably provided, each, with a brass rivet 1-R or like cam means somewhat medially thereof to engage respective sides of plate 3 as screw 19 pulls it upward, and are disposed and dimensioned to spread arms 1,1' apart sufficient to "clear" the prescribed "work" (e.g., PGA) prior to insertion or extraction thereof (cf. so spread in FIG. 1, FIG. 3A).

Typical Operation: Insertion

Tool i/e will be assumed as here adapted for inserting the 224 pin PGA package 8 into associated PGA socket 9 which is attached (e.g., soldered) onto "unfixed" PC board 10. First, PGA package 8 will be assumed as positioned atop socket 9 with its pins appropriately registered with receiving holes in the socket. Then, tool i/e will be taken up by the operator and placed in "insertion mode", with adapter magnetically coupled to plate 3 (see FIG. 1, with pad 6 thrust vs. plate 3 and arms 1,1' suitably "spread-open" (FIG. 1).

Thus, screw 19 will have been rotated sufficient to retract stop 18 vs. block 11 (as in FIG. 1) and plate 3 plus adapter 5 will have been relatively fully withdrawn into the tool body as illustrated in FIG. 1, (e.g., one may turn knob 2 until jack screw 19 has so lifted plate 3 etc. until stop 18 bottoms vs. block 11). This, in turn, will draw plate 3 into engagement with cam-rivets 1-R on arms 1,1' and so spread them apart. The preset length of screw 19 and position of lower stop 18 will determine how far up screw 19 can draw plate 3, etc. The position and size of cams 1-R will determine when, and how much, arms 1,1' will spread.

Thereupon, tool i/e will be presented to the work (8, 9 FIG. 1A), with adapter 5 (pad 7 thereon) positioned just above the surface of package 8. The turned edges 1-e of arms 1,1' are to be positioned under the base of socket 9 as illustrated in FIG. 2. Now, the operator may begin to rotate jack screw 19 to thrust plate 3 etc., away from block 11 and disengage arms 1,1' from cams 1-R so the arms come together and engage socket 9. This rotation of screw 19 (knob 2) will precisely, gradually thrust adapter 5 downward and, thereby, thrust package 8 and the pins thereof into their receiving apertures in socket 9. This moves the pressure plate 3 (and magnetically coupled adapter 5) down against the package 8—continuing until package 8 nearly "bottoms" in socket 9—whereupon upper stop 4 will have been arranged to limit the travel of screw 19 and prevent "bottoming", or excessive thrust, of the package into the socket.

It will be recognized that magnetic rubber strip 6 is provided to removably couple adapter 5 to pressure plate 3 and allow it to be so stored during "non-extraction" times, to thus avoid having the parts loose, and misplaced or lost. Rubber pad 7 will cushion and distribute the pressure applied to package 8 during this insertion, as workers will recognize.

Extraction: FIGS. 3A, 3B

The extraction operation is similar. With stop 18, and plate 3 etc. retracted (FIG. 1), adapter 5 is removed from the tool (pulled off plate 3) and located over package 8 which is assumed as inserted into socket 9 on board 10 (see FIG. 3A). With arms 1,1' spread as in FIG. 3A, tool i/e will be dropped over adapter 5 and plate 3 lowered until, with arm tips 1-e inserted between PGA 8 and socket 9, plate 3 "bottoms" on adapter 5 (on pad 7 thereof). That is, screw 19 will be rotated and pad 7 etc. lowered, until gripper arms 1,1' come together with their tips placed under the distal face of package 8 (between package 8 and socket 9—see FIG. 3); then knob 2 will be further rotated to firmly thrust plate 3, down against pad 7, sufficient to "bottom" onto socket 9. Further rotation will force the gripper arms 1,1' to pull up and extract the package 8, pulling it away from socket 9 as workers will recognize (sufficient clearance understood under pad 7 via legs 5-S).

Recapitulating, in summary: to insert a PGA package, the tool's lead screw (via attached plates, etc.) thrusts the PGA outward against its socket (which is held engaged against movement by side arm tips); while to extract a PGA package from its socket, one engages the tool to firmly grip the PGA (between arm tips and pad 7 etc.) and then pulls-out the PGA. One "covers" the PGA/socket with a tool-adapter and engages the distal side of the PGA with said sidearm tips, then thrusts the lead screw vs. this adapter, forcing these arm tips to draw the PGA up, toward the lead screw, and out of its socket.

Storage of this adapter on the tool during non-extraction times (e.g. via removable magnetic coupling) is an added feature.

Workers will recognize that such an insertion/extraction tool thus conveniently provides both insertion and extraction functions for PGA packages, reducing the number of tools required at a user's site, inserting and extracting somewhat more precisely, gradually and reliably than with presently available tools, with insertion being somewhat safer through the use of a stop to automatically limit travel of the PGA into its socket and prevent "bottoming" and like damage. Workers will find that insertion and extraction using this tool will produce no damage to the package or its socket and that the dual-purpose too: is easy and convenient to use. This can reduce the number of special tools etc. required at a user site.

Conclusion:

It will be understood that the preferred embodiments described herein are only exemplary, and that the invention is capable of many modifications and variations in construction, arrangement and use without departing from the spirit of what is claimed.

Further modifications of the invention are also possible. For example, the means and methods disclosed herein are also somewhat applicable to other plugable packages such as a 16×16 PGA and associated socket. Also, the present invention is applicable for other like package means.

The above examples of possible variations of the present invention are merely illustrative. Accordingly, the present invention is to be considered as including all possible modifications and variations coming within the scope of the invention as defined by the appended claims.

What is claimed is:

1. A bi-part composite insertion/extraction tool for inserting a circuit package into receiving socket means and for extracting it therefrom, this tool comprising reversible drive means and separate co-operating adapter means;

said drive means comprising body means and means for urging said body means toward, and away from, said package;

said body means including grip means projecting form said body means for selectively engaging said package and urging it toward said body means during "package-extraction" and for engaging said socket means and urging it toward said body means during "package-insertion";

said adapter means having means for cooperatively coupling with said body means in a "first position" during said "package-extraction" during which said adapter means functions to aid extraction, and for cooperatively coupling with said body means in a "second position," different from said "first position," during "package insertion."

2. The tool of claim 1, wherein said adapter means includes recess means for accommodating full-extraction of the subject package.

3. The tool of claim 1, wherein said grip means includes cam means for engagement with said drive means, to thereby spread said grip means apart.

4. The tool of claim 1, wherein said adapter means includes a magnetic rubber pad secured thereon for said attachment to said body means.

5. The tool of claim 1, wherein said grip means comprise a pair of elongate arms with distal tip portions that are bent to so engage the package or the socket means.

6. The tool of claim 5, wherein said grip means includes cam means for engagement with said body means, to thereby spread said grip means apart.

7. The tool of claim 9, wherein said drive means comprises rotatable lead-screw means plus stop means for limiting screw travel.

8. The tool of claim 7, wherein the package is a pin grid array.

9. The tool of claim 1, wherein said adapter means includes means for storage thereof on said tool during insertion and other non-extraction times, said adapter means comprising a U-shaped adapter with a pair of leg sections joined by a bridge section, said bridge section including magnetic coupling means for removably attaching said adapter means to said body means, at a contact portion thereof, said contact portion comprising a flat metal plate.

10. Tool of claim 9, wherein said adapter means includes a magnetic rubber pad secured thereon for said attachment to said contact portion.

11. The invention of claim 1, wherein said grip means comprises a pair of elongate arms with distal tip portions presenting inwardly-projected engagement means for so engaging the package or the socket means.

12. The tool of claim 11, wherein said grip means includes cam means for engagement with said body means, to thereby thrust-apart said arms.

13. The tool of claim 12, wherein said drive means further includes a pair of stop means for limiting drive travel.

14. The tool of claim 13, wherein said adapter means comprises a U-shaped adapter with a pair of leg sections joined by a bridge section, said bridge section including magnetic coupling means for removably attaching said adapter means to said body means.

15. The tool of claim 14, wherein said drive means comprises a lead screw structure.

16. The tool of claim 15, wherein said screw structure includes distal contact means on the working end thereof, said adapter bridge section being constructed for removably coupling one face thereof to this contact means during package-extraction, and for removably coupling the opposite face thereof to this contact means during package-insertion.

17. The tool of claim 16, wherein at least the contact portions of these bridge faces are each covered with a respective elastomeric layer.

18. The tool of claim 17, wherein one said elastomeric layer is magnetic for so coupling said adapter to said screw structure of said drive means.

* * * * *

UNITED STATES PATENT AND TRADEMARK OFFICE
CERTIFICATE OF CORRECTION

PATENT NO.  : 4,984,355
DATED       : January 15, 1991
INVENTOR(S) : ROCCO V. LUBRANO, et al It is certified that error appears in the above-identified patent and that said Letters Patent is hereby corrected as shown below:

On the title page:
Line 2 of the Abstract, "multi-in" should be ---multi-pin---.

Col. 1, line 14, before "manufacturing" please insert parenthesis.

Col. 1, line 50, delete the first "7A" and change "are" to ---is---.

Col. 1, line 52, delete the first "8A" and change "are" to ---is---.

Col. 2, line 47, change "1.1" to ---11---.

Col. 5, line 40, change "too:" to ---tool---.

Col. 6, line 5, change "form" to ---from---.

Signed and Sealed this

Twenty-eighth Day of July, 1992

Attest:

DOUGLAS B. COMER

*Attesting Officer*   *Acting Commissioner of Patents and Trademarks*